(12) United States Patent
Chien et al.

(10) Patent No.: US 6,281,081 B1
(45) Date of Patent: Aug. 28, 2001

(54) METHOD OF PREVENTING CURRENT LEAKAGE AROUND A SHALLOW TRENCH ISOLATION STRUCTURE

(75) Inventors: Sun-Chieh Chien, Hsinchu; Chien-Li Kuo, Hsinchu Hsien; Tzung-Han Lee, Taipei; Wei-Wu Liao, Taipei Hsien, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/192,042

(22) Filed: Nov. 13, 1998

(51) Int. Cl.$^7$ ............................ H01L 21/336; H01L 21/76
(52) U.S. Cl. ............................ 438/296; 438/424; 438/433
(58) Field of Search .................................. 438/296, 424, 438/433

(56) References Cited

U.S. PATENT DOCUMENTS 5,891,771 * 4/1999 Wu et al. .
6,057,208 * 5/2000 Lin et al. .

* cited by examiner

Primary Examiner—John F. Niebling
Assistant Examiner—Josetta Jones
(74) Attorney, Agent, or Firm—Hickman Coleman & Hughes, LLP

(57) ABSTRACT

An ion implantation method useful for fabricating shallow trench isolation structureimplants phosphorus ions instead of arsenic ions into a substrate when the source/drain regions of an NMOS device are doped. Alternatively, low energy ions are used in the ion implantation for forming the source/drain regions of an NMOS device. Consequently lattice dislocations of the crystal structure within a substrate is reduced and unwanted device leakage current is eliminated.

27 Claims, 3 Drawing Sheets

METHOD OF PREVENTING CURRENT LEAKAGE AROUND A SHALLOW TRENCH ISOLATION STRUCTURE

BACKGROUND OF THE INVENTION

1. Field of Invention

The present invention relates to a method of manufacturing a shallow trench isolation. More particularly, the present invention relates to a method of preventing current leakage around a shallow trench isolation structure by controlling the ion implantation process.

2. Description of Related Art

A metal-oxide-semiconductor (MOS) typically comprises source/drain regions and a gate on a substrate. To form the source/drain regions and to adjust a threshold voltage of the substrate, pentavalent or trivalent ions are implanted. For example, pentavalent ions are implanted into a P-type substrate to form the source/drain region of an NMOS device. The purpose of doping the substrate with ions is to transform the electrical properties of the wafer. While being accelerated and implanted to a silicon wafer, the ions with an energy collide with silicon atoms of the wafer until the energy of the ions is consumed and released. Typically, ion implantation processes employ ions having an energy level of between 50 to 500 KeV. Hence, the ions are implanted at a position under the substrate surface with a depth between 0.01 $\mu$m to 1 $\mu$m.

In ion implantation, an ion implanter is used to generate a beam of high-energy ions, which are injected into the substrate. In the fabrication process of semiconductor devices, ion implantation technique has several advantages such as is free from contamination, large area of impurity distribution, performed in a room temperature, precis distribution of concentration. Over the solid solubility, and to dope certain area as required. Hence, ion implantation is widely used in semiconductor fabrication.

However, ion implantation also has its disadvantages. The lattice structure of the substrate is easily destroyed or damaged, so that a high temperature annealing process is required to rearrange the lattice structure. By controlling the temperature and process time, impurities are electrically activated, that is, the carriers regain a mobility under an equilibrium. Thus, the damage of the lattice structure is mended. The temperature and annealing period must be carefully controlled to avoid to converted properties of selected materials. Yet, while ions are implanted with a very large energy, or very heavy ions are implanted, the damage of lattice structure is too serious to mend.

In integrated circuits of VLSI or ULSI, the number of transistors included is huge and the devices are densely packed together. Therefore, in order to prevent any short-circuiting between neighboring transistors, the neighboring transistors have to be isolated by an isolation structure. The most general type of device isolation structure is shallow trench isolation. In the process of forming an NMOS transistor, the source/drain regions are formed by performing an ion implantation. Arsenic (As) ions are implanted into a P-type substrate so that an N-type source/drain region is formed. However, since an arsenic ion has a high atomic weight, serious dislocation of the crystal lattice may occur after the ion implantation. Consequently, leakage current may flow from the device. As line width of semiconductor device falls to below 0.25 $\mu$m, isolating devices using a field oxide layer become infeasible. Therefore, shallow trench isolation becomes the only means of device isolation. However, the formation of a shallow trench isolation structure within the substrate tends to retain internal stress. If dopants having a high atomic weight are used in ion implantation, large voids or defects may be generated within the crystal lattice. These voids or defects may not disappear even after a high-temperature annealing treatment inside a furnace. In addition, the annealing temperature and annealing period is further restricted by the demand for minimum device reliability. Ultimately, these crystal defects may lead to the flow of a leakage current from the device.

SUMMARY OF THE INVENTION

Accordingly, the present invention provides a method of preventing current from leaking around a shallow trench isolation structure. The method is capable of eliminating the crystal lattice dislocations caused by the formation of an NMOS transistor nearby. Hence, leakage current from the isolation structure is reduced and functionality of the device is maintained.

To achieve these and other advantages and in accordance with the purpose of the invention, as embodied and broadly described herein, the invention provides a method of preventing current leaking around a shallow trench isolation structure. The method includes carrying out an ion implantation using phosphorus ions instead of arsenic ions. Since phosphorus has a lower atomic weight than arsenic, the effect of damage caused by phosphorus ion implantation on the crystal latticeis smaller than using arsenic ions. Hence, lattice dislocations in the crystal structure are much more easily removed by an annealing process, and leakage current around the shallow trench isolation structure after the phosphorus ion implantation is greatly reduced.

In another aspect, this invention provides a method of preventing current leaking around a shallow trench isolation structure. The method includes reducing the energy level of ions in ion implantation. thereby reducing the degree of damage to the crystal lattice structure. Therefore, lattice dislocations in the crystal structure are fewer and a highly regular lattice structure can be restored after an annealing treatment. Thus, leakage current around the shallow trench isolation structure is again reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
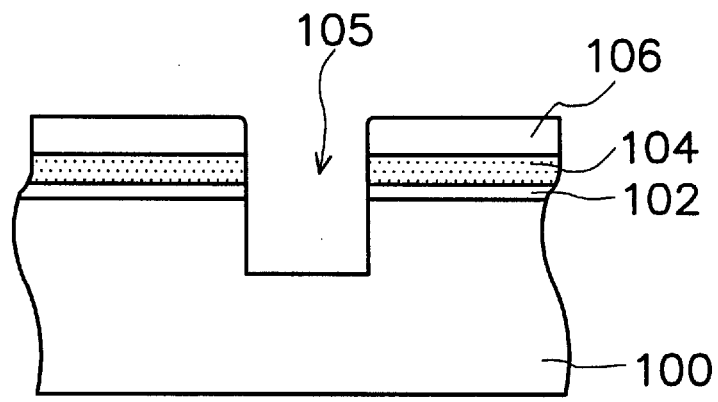
FIGS. 1 through 1E are schematic, cross-sectional views showing the progression of manufacturing steps in fabricating a shallow trench isolation structure.

Reference will now be made in detail to the present preferred embodiments of the invention, examples of which are illustrated in the accompanying drawings. Wherever possible, the same reference numbers are used in the drawings and the description to refer to the same or like parts.

The first embodiment of this invention is illustrated using FIGS. 1A through 1E, where FIGS. 1A through 1E are schematic, cross-sectional views showing the progression of manufacturing steps in fabricating a shallow trench isolation structure.

As shown in FIG. 1A, a pad oxide layer 102 and a mask layer, for example, a silicon nitride layer 104 is used in the embodiment, are sequentially formed over a semiconductor substrate 100. A photoresist layer 106 is formed over the silicon nitride layer 104. A photolithographic and etching operation is carried out to form a trench 108 in the substrate 100 through the silicon nitride layer 104 and the pad oxide layer 102. Since different material layers have to be removed during the trench-forming operation. an etching operation with a high degree of anisotropy for different materials must be used.

Figure 1B:
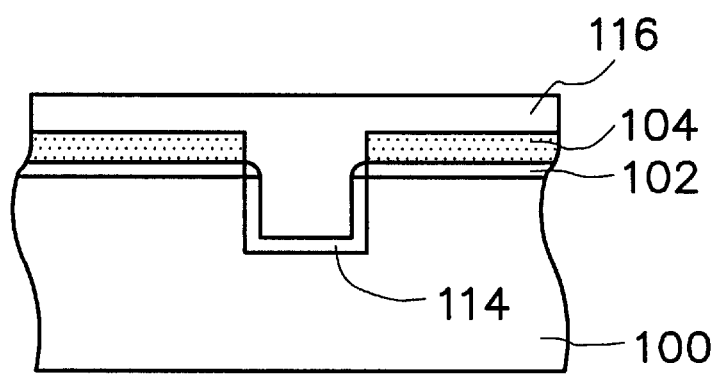

As shown in FIG. 1B, the photoresist layer 106 is removed. A liner oxide layer 114 is formed over the exposed substrate surface of the trench 108. An insulation layer 116 is formed over the silicon nitride layer 104 and completely fills the trench 108, using a chemical vapor deposition method.

Figure 1C:
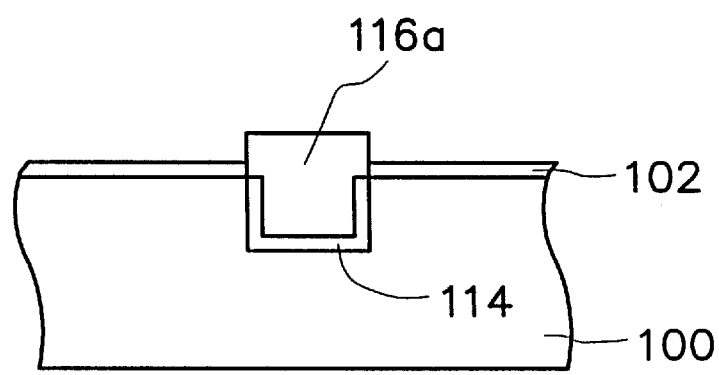

As shown in FIG. 1C, using the silicon nitride layer 104 as an etching barrier layer, portions of insulation layer 116 outside the trench area are removed. Therefore, the silicon nitride layer 104 underneath the insulation layer 116 is exposed and a planarized surface is obtained. The insulation layer 116 can be removed using, for example, a chemical-mechanical polishing method. Preferably, the remaining insulation layer 116a and the liner oxide layer 114 are still embedded within the trench 108.

Figure 1D:
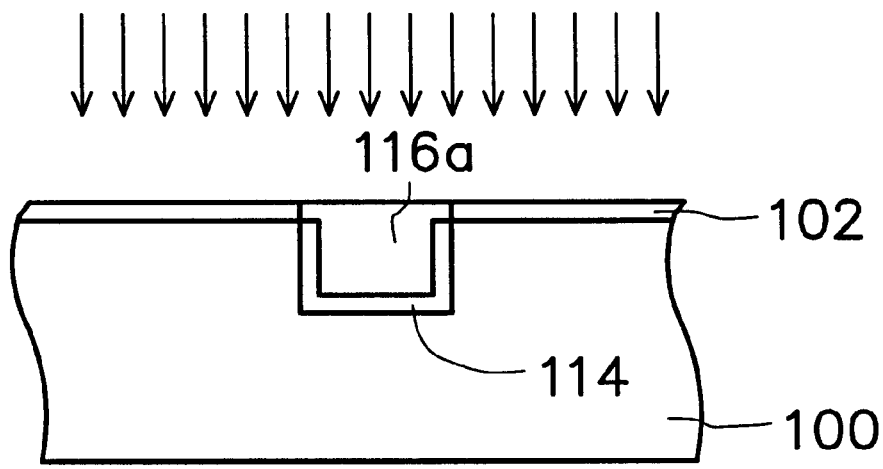

As shown in FIG. 1D, the silicon nitride layer 104 is removed. An ion implantation process is carried out to adjust the threshold voltage of the substrate 100. The pad oxide layer 102 prevented the substrate 100 from being directly implanted by ions. so that the damage of the substrate is reduced. That is, the pad oxide layer 102 serves as a sacrificial layer to reduce damages caused by ion bombardment. Moreover, the pad oxide layer 102 prevents ions from passing directly through lattice vacancies and resulting in a channel effect.

In ion implantation, phosphorus ions are accelerated by an ion implanter to a high speed and implanted into the interior of a substrate to adjust its threshold voltage. The implanted phosphorus ions then undergo a rapid thermal annealing (RTA) treatment to heat the silicon chip to a temperature over 1000°C. for a brief period.

Exposing the substrate to a high temperature for a brief period restores the damaged lattice within the substrate without severely affecting the internal distribution of ions.

Figure 1E:
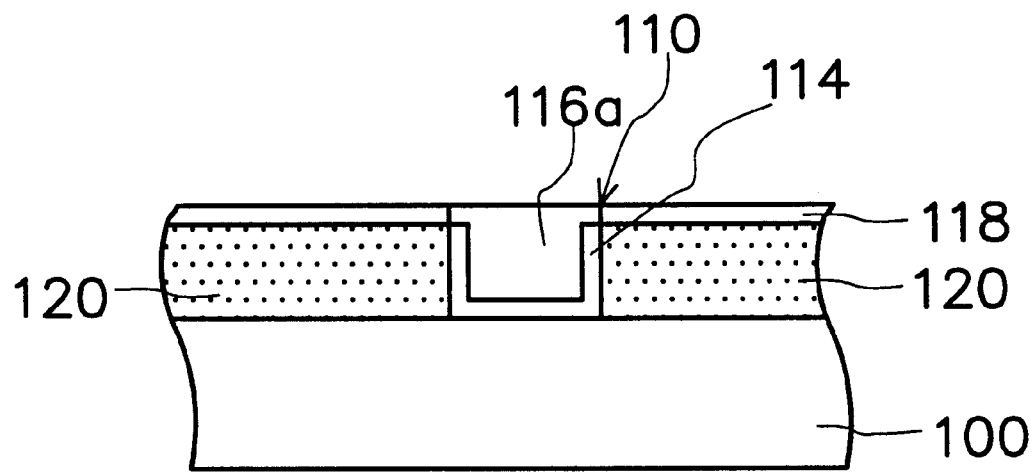

As shown in FIG. 1E, the pad oxide layer 102 is removed to expose the insulation layer 116a and the substrate 100. The substrate is placed inside a furnace to grow a gate oxide layer 118 over the substrate 100. Hence, a planarized surface without any recess cavities is formed at the junction 112 where the insulation layer 112a and the trench 108 meet. On the other hand, if a recess cavity 110 at the junction 112 is really formed, unexpected electrical conduction between the device and conductive structure may occur. From the aforementioned description, the ion implantation method of this invention associated with the steps performed for fabricating a trench isolation structure is capable of preventing current leaking through the trench sidewalls to the bottom part of the trench.

The second embodiment of this invention is again illustrated using FIGS. 1A through 1E.

As shown in FIG. 1A, a pad oxide layer 102 and a silicon nitride layer 104 are sequentially formed over a semiconductor substrate 100. A photoresist layer 106 is formed over the silicon nitride layer 104. A photolithographic and etching operation is carried out to form a trench 108 in the substrate 100 through the silicon nitride layer 104 and the pad oxide layer 102.

As shown in FIG. 1B. the photoresist layer 106 is removed. A liner oxide layer 114 is formed over the exposed substrate surface of the trench 108. An insulation layer 116 is formed over the silicon nitride layer 104 and completely fills the trench 108 using a chemical vapor deposition method.

As shown in FIG. 1C, using the silicon nitride layer 104 as an etching barrier layer, portions of insulation layer 116 outside the trench area are removed. Therefore, the silicon nitride layer 104 underneath the insulation layer 116 is exposed and a planarized surface is obtained. The insulation layer 116 can be removed using, for example, chemical-mechanical polishing. Preferably, the remaining insulation layer 116a and the liner oxide layer 114 are still embedded within the trench 108.

As shown in FIG. 1D, the silicon nitride layer 104 and the pad oxide layer 102 are removed. A dielectric layer 118 is deposited over the substrate 100 using chemical vapor deposition. An ion implantation operation is carried out to adjust the threshold voltage of the substrate 100.

Figure 2A:
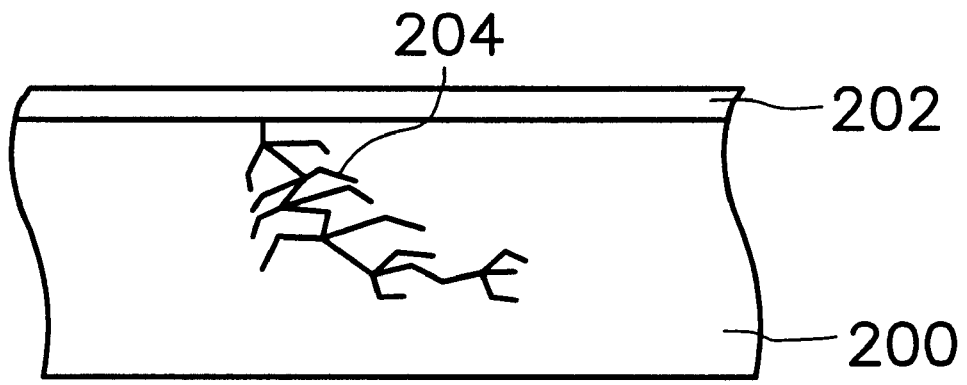
FIG. 2A is a diagram showing the travelling path one of an ion implanted.
Figure 2B:
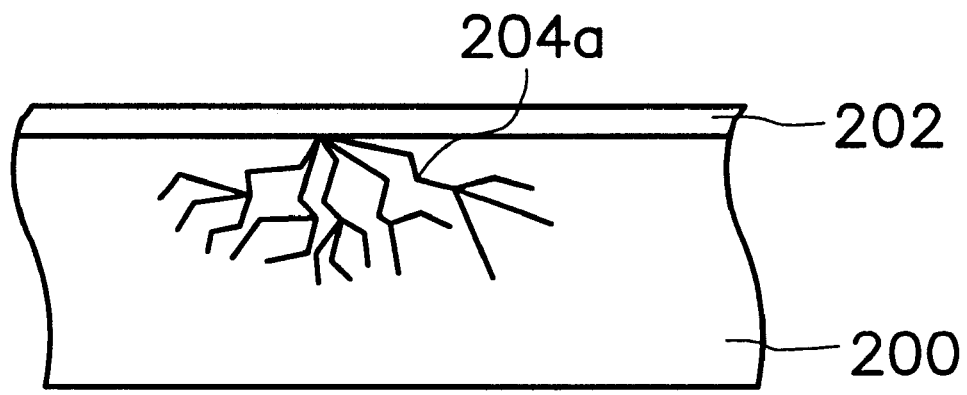
FIG. 2B is a diagram showing the travelling path of heavy ions, or high-energy ions during anion implantation operation.

In the ion implantation process arsenic ions are preferably used, though other ions may also be used. However, the implantation energy of the arsenic ions is reduced. FIG. 2A is a diagram showing the path traveled by one of the light or low-energy ions during an ion implantation operation, while FIG. 2B is a diagram showing the path traveled by one of the heavy or high-energy ions during an ion implantation operation. As shown in FIG. 2A, when the implantation energy of ions is low, the resulting damages imparted to the crystal lattice are small. On the other hand, when the implantation energy of ions is high, the resulting damages imparted to the crystal structure are great. Therefore, after performing a rapid thermal annealing (RTA) operation, a crystal lattice structure having minor lattice dislocations can be restored. Consequently, by reducing the implantation energy, irreversible destruction of the lattice structure is prevented.

As shown in FIG. 1E, the dielectric layer 118 is removed to expose the insulation layer 116a and the substrate 100. The substrate is placed inside a furnace to grow a gate oxide layer 118 over the substrate 100. Hence, a planarized surface having no recess cavities is formed at the junction 112 where the insulation layer 112a and the trench 108 meet. Since no recess cavity 110 at the junction 112 is really formed, unexpected electrical conduction between the device and conductive structure will not occur.

In summary, one major aspect of this invention is the implantation of phosphorus ions instead of arsenic ions so that the amount of crystal lattice damage within a substrate is reduced. Consequently, any resulting leakage current flowing out from the crystal/oxide interface or any corner regions at the bottom of the trench is considerably lowered.

In another aspect of this invention, the degree of lattice destruction can be similarly reduced by lowering the implantation energy of the arsenic ions. Hence, leakage current can be greatly reduced as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming shallow trench isolation, comprising the steps of:

providing a substrate;

forming a pad oxide layer and a mask layer on the substrate;

forming a trench in the substrate;

forming an insulation layer over the substrate and filling the trench;

removing a portion of the insulation layer until the mask layer is exposed; and performing an ion implantation by implanting phosphorus ions into the substrate around the trench.

2. The method of claim 1, wherein the step of performing the ion implantation includes using an ion implanter.

3. The method of claim 1, wherein the mask layer includes a silicon nitride layer.

4. The method of claim 1, wherein the step of forming the insulation layer includes depositing oxide material.

5. The method of claim 4, comprising further the step of densifying the insulation layer after forming the insulation layer.

6. The method of claim 5, wherein the step of densifying the insulation layer includes heating the insulation layer.

7. The method of claim 1, wherein the step of forming the insulation layer includes using atmospheric pressure chemical vapor deposition.

8. The method of claim 7, wherein the step of forming the insulation layer includes using tetra-ethyl-ortho-silicate as a gaseous reactant.

9. The method of claim 1, wherein the step of removing a portion of the insulation layer includes using a chemical-mechanical polishing operation.

10. The method of claim 1, wherein the step of forming the dielectric layer includes depositing silicon oxynitride.

11. The method of claim 1, wherein the step of forming the dielectric layer includes depositing silicon nitride.

12. The method of claim 1, wherein the step of removing the dielectric layer includes using hydrofluoric acid solution.

13. The method of claim 1, wherein the step of removing the dielectric layer includes using phosphoric acid.

14. A method of forming shallow trench isolation, comprising the steps of:

providing a substrate;

forming a pad oxide layer and a mask layer on the substrate;

forming a trench in the substrate;

forming an insulation layer over the substrate and filling the trench;

removing a portion of the insulation layer until the mask layer is exposed;

performing a low energy ion implantation by implanting ions into the substrate on either side of the trench, whereby the energy being low enough that irreversible destruction of a lattice structure is prevented;

removing the pad oxide layer; and forming a gate oxide layer on the substrate.

15. The method of claim 14, wherein the mask layer includes a silicon nitride layer.

16. The method of claim 14, wherein the low energy ion implantation includes implanting arsenic, phosphorus and other types of ions.

17. The method of claim 14, wherein the step of performing the low energy ion implantation includes using an ion implanter.

18. The method of claim 14, wherein the step of forming the insulation layer includes depositing oxide material.

19. The method of claim 14, comprising further the step of densifying the insulation layer after the step of forming the insulation layer.

20. The method of claim 19, wherein the step of densifying the insulation layer includes heating the insulation layer.

21. The method of claim 14, wherein the step of forming the insulation layer includes using atmospheric pressure chemical vapor deposition.

22. The method of claim 21, wherein the step of forming the insulation layer includes using tetra-ethyl-ortho-silicate as a gaseous reactant.

23. The method of claim 14, wherein the step of removing a portion of the insulation layer includes using a chemical-mechanical polishing operation.

24. The method of claim 14, wherein the step of forming the dielectric layer includes depositing silicon oxynitride.

25. The method of claim 14, wherein the step of forming the dielectric layer includes depositing silicon nitride.

26. The method of claim 14, wherein the step of removing the dielectric layer includes using hydrofluoric acid solution.

27. The method of claim 14, wherein the step of removing the dielectric layer includes using phosphoric acid.

* * * * *